(12) United States Patent
Jeong

(10) Patent No.: US 7,834,350 B2
(45) Date of Patent: Nov. 16, 2010

(54) SEMICONDUCTOR DEVICE WITH TEST PADS AND PAD CONNECTION UNIT

(75) Inventor: Woo-Seop Jeong, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 331 days.

(21) Appl. No.: 12/004,401

(22) Filed: Dec. 20, 2007

(65) Prior Publication Data
US 2008/0157076 A1 Jul. 3, 2008

(30) Foreign Application Priority Data
Dec. 27, 2006 (KR) ............... 10-2006-0135297

(51) Int. Cl.
*H01L 23/58* (2006.01)
(52) U.S. Cl. ........... 257/48; 257/734; 257/E21.521; 257/E21.522; 257/E21.526; 438/14
(58) Field of Classification Search ............ 257/48, 257/734, 778, 786, E21.521–E21.531; 438/15–18
See application file for complete search history.

(56) References Cited
U.S. PATENT DOCUMENTS
5,286,656 A * 2/1994 Keown et al. ............ 438/18
5,920,765 A * 7/1999 Naum et al. ............ 438/18
6,127,729 A * 10/2000 Fukuda .................. 257/736
2004/0238818 A1 12/2004 Kim

OTHER PUBLICATIONS

Korean Patent Application No. 1020040111254 to Chuan et al., having Publication date of Jun. 28, 2006 (w/ English Abstract page).
Korean Patent Application No. 1020030015696 to Kim, having Publication date of Sep. 20, 2004 (w/ English Abstract page).
Japanese Patent Application No. 2000-400831 to Yoshiyuki et al., having Publication date of Jul. 19, 2002 (w/ English Abstract page).
Japanese Patent Application No. 2005-073682 to Shigeyuki, having Publication date of Oct. 27, 2005 (w/ English Abstract page).

* cited by examiner

*Primary Examiner*—Jasmine J Clark
(74) *Attorney, Agent, or Firm*—Monica H. Choi

(57) ABSTRACT

A semiconductor device includes at least one first type of pad and at least one second type of pad having a different area from the first type of pad. A pad connection unit electrically couples the at least one second type of pad to an integrated circuit of the semiconductor device during a test mode, and disconnects the at least one second type of pad from the integrated circuit during a normal operating mode.

19 Claims, 5 Drawing Sheets

SEMICONDUCTOR DEVICE WITH TEST PADS AND PAD CONNECTION UNIT

This application claims priority under 35 USC §119 to Korean Patent Application No. 2006-135297, filed on Dec. 27, 2006 in the Korean Intellectual Property Office, the disclosure of which is incorporated herein in its entirety by reference.

BACKGROUND OF THE INVENTION

1. Field of the Invention

The present invention relates generally to semiconductor devices, and more particularly, to a semiconductor device having test pads and a pad connection unit that connects a test pad to an integrated circuit of the semiconductor device during a test operating mode.

2. Background of the Invention

Semiconductor devices, such as semiconductor memory devices, are desired to operate with higher bandwidths. Particularly, in order to improve the system operating characteristics of today's mobile memory products, an increase in the number of input/output (IO) pins that simultaneously transfer data is desired. However, increase in the number of IO pins is limited by chip size, packaging, and many other restrictions. For example, in the case of 256-bit data, 500 or more balls are required for a package ball out. However, fabricating a package with 500 or more balls is impossible in actual practice. This impracticality especially applies to cases in which a small package size is required, such as in the mobile memory device market.

A new packaging technology called micro-bump (μ-bump) is gaining prominence. Point to point access is performed between a control chip and a memory chip in a typical mobile product. Thus, μ-bump is a packaging technology that directly connects a control chip to a memory chip without the use of wires by matching the respective pads of the control and memory chips according to signals to be transferred.

However with significant size decrease in μ-bump technology, probing of pads during wafer testing may be difficult. Namely, probing small pads formed on a wafer with integrated circuit dies intended for μ-bump technology may be difficult.

SUMMARY OF THE INVENTION

Accordingly, the present invention includes larger test pads used during testing such as wafer testing of a semiconductor device.

A semiconductor device according to an aspect of the present invention includes at least one first type of pad and at least one second type of pad having a different area from the first type of pad. In addition, a pad connection unit electrically couples the at least one second type of pad to an integrated circuit of the semiconductor device during a predetermined operating mode such as a test mode.

In an example embodiment of the present invention, the pad connection unit disconnects the at least one second type of pad from the integrated circuit during an operating mode that is not the predetermined operating mode. For example, the pad connection unit generates a high impedance between the at least one second type of pad and the integrated circuit during the operating mode that is not the predetermined operating mode.

According to another embodiment of the present invention, the at least one second type of pad has a larger area than an area of the at least one first type of pad. Such a larger area of the at least one second type of pad makes sufficient electrical contact with a testing probe placed thereon during wafer testing of the semiconductor device. In another embodiment of the present invention, the at least one second type of pad is disposed in a periphery area of the semiconductor device, and the at least one first type of pad is disposed in a center area of the semiconductor device. In an example embodiment of the present invention, the at least one first type of pad is a bump pad for the semiconductor device that is a memory device formed as part of a flip-chip package.

In a further example embodiment of the present invention, the pad connection unit includes an output buffer and pass-gates. The output buffer is coupled to the at least one second type of pad. The pass-gates are controlled by a mode control signal to electrically couple the integrated circuit to the at least one second type of pad via the output buffer during the predetermined operating mode. For example, the pass-gates are controlled to electrically couple at least one predetermined node of the integrated circuit to the at least one second type of pad during the predetermined operating mode.

In another embodiment of the present invention, the semiconductor device includes another output buffer electrically coupled to the at least one predetermined node at all times.

In another aspect of the present invention, the pad connection unit disconnects the at least one first type of pad from the integrated circuit during the predetermined operating mode. However, the pad connection unit electrically couples the at least one first type of pad to the integrated circuit for an operating mode that is not the predetermined operating mode. In addition, the pad connection unit disconnects the at least one second type of pad from the integrated circuit during the operating mode that is not the predetermined operating mode.

In this manner, the larger test pads are selectively used such as by probing during testing of the semiconductor device. For example, the semiconductor device may be an integrated circuit die that is wafer tested during fabrication.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
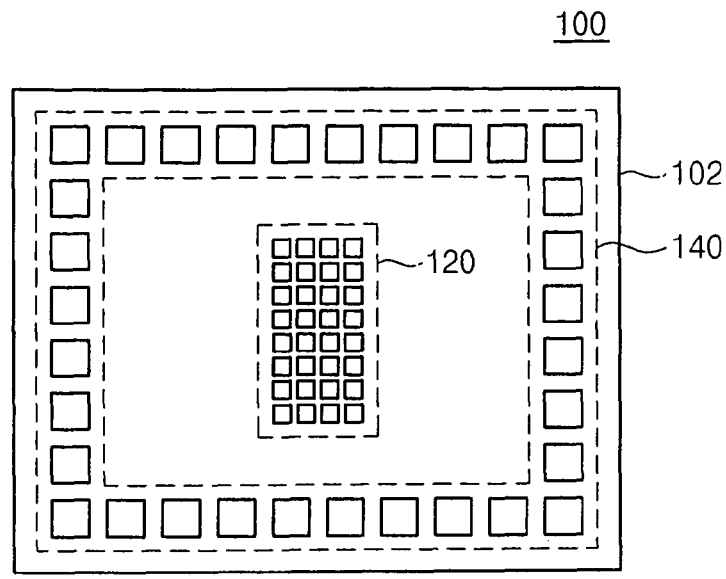
FIG. 1 is a plan view of a semiconductor device, such a semiconductor memory device according to an embodiment of the present invention.

FIG. 1 is a plan view of a semiconductor device 100 such as a semiconductor memory device for example according to an embodiment of the present invention. Referring to FIG. 1, the semiconductor memory device 100 includes first type of pads 120 and second type of pads 140. In an example embodiment of the present invention, the first and second types of pads 120 and 140 are formed on an integrated circuit die 102. Just the one integrated circuit die 102 is illustrated in FIG. 1, but the integrated circuit die 102 is fabricated as part of a whole semiconductor wafer that is wafer tested during fabrication of multiple integrated circuit dies on the semiconductor wafer.

According to an aspect of the present invention, each of the second type of pads 140 has an area that is larger than an area of each of the first type of pads 120. For example, the semiconductor memory device 100 may be fabricated to be part of flip-chip packaging or bump packaging. In that case, the first type of pads 120 are formed as micro-bump pads. For example, solder creams for micro-bumps having a powder particle size of 5-10 μm are available.

Flip-chip packaging is not a specific package or packaging method per se, but is an assembling/mounting method that electrically contacts the integrated circuit die to electrode terminals. Unlike wire bonding packaging using wires for wiring, flip-chip packaging uses conductive bumps on integrated circuit die surfaces as wiring. Because the bumps formed on the die are flipped and directly connected to the carrier, the process is called flip-chip packaging. This flip-chip packaging process is used for system on chip (SoC), system in package (SiP), and system on package (SoP) applications.

The second type of pads 140 are pads used during testing such as during wafer testing. Thus, the area of the second type of pads 140 makes sufficient electrical contact with a respective test probe that is placed onto each of the second type of pads 140. For example, during wafer testing using a typical test probe, testing with the second type of pads 140 having a pitch of 60 μm pitch or greater is possible. However with more advances in test equipment, a smaller size of the second type of pads 140 is possible.

Figure 2:
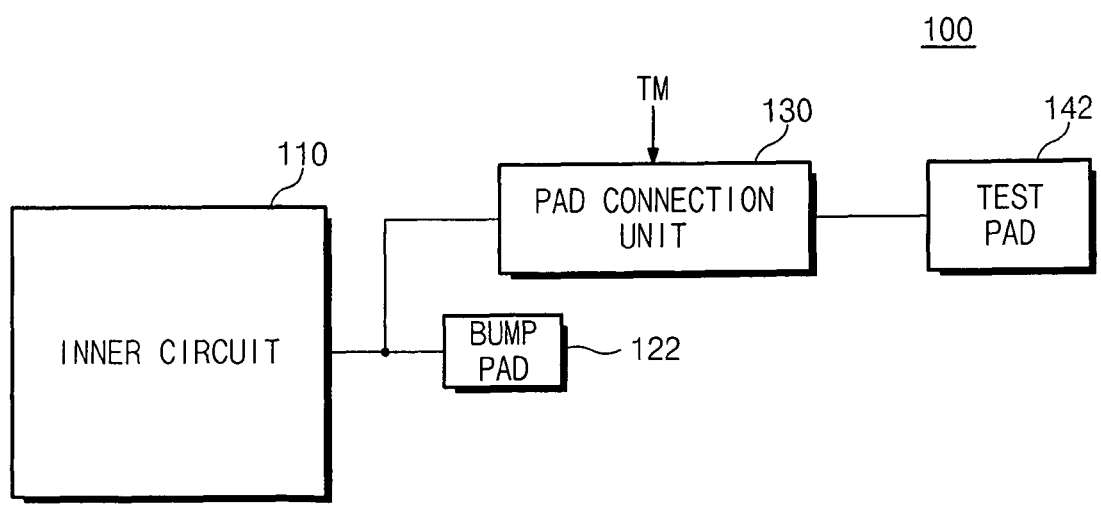
FIG. 2 is a block diagram of a portion of the semiconductor memory device of FIG. 1, according to an embodiment of the present invention.

FIG. 2 shows a block diagram of a portion of the semiconductor memory device 100 according to an embodiment of the present invention. The semiconductor memory device 100 includes an inner integrated circuit 110, a bump pad 122, a pad connection unit 130, and a test pad 142. The bump pad 122 is one of the first type of pads 120, and the test pad 142 is one of the second type of pads 140. Such components 110, 122, 130, and 142 are fabricated as part of the integrated circuit die 102.

In the example embodiment of FIG. 2, the first type of pads 120 are directly connected to the integrated circuit 110. The second type of pads 140 are electrically connected to or disconnected from the integrated circuit 110 by the pad connection unit 130 depending on an operating mode of the semiconductor memory device 100.

The first type of pads 120 are used for signal transfer to/from the integrated circuit 110 during a normal operating mode of the semiconductor memory device 100. The second type of pads 140 are used for signal transfer to/from the integrated circuit 110 during a test mode such as wafer testing of the semiconductor memory device 100. A mode signal TM indicates one of the normal operating mode and the test mode to the pad connection unit 130. The mode signal TM may be provided from the outside during testing such as by an external tester or may be provided from the internal integrated circuit 110 of the semiconductor memory device 100.

Figure 3:
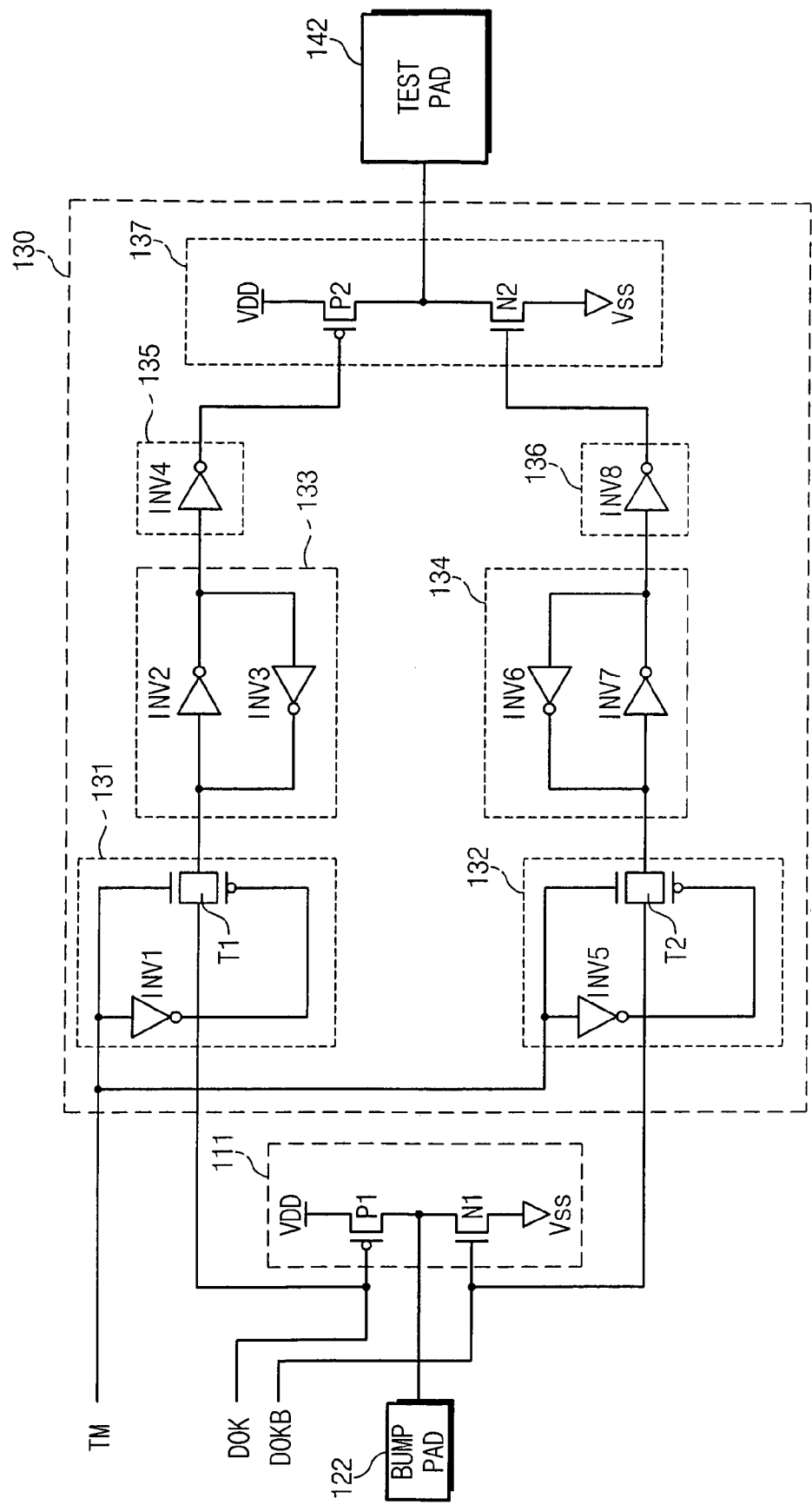
FIG. 3 is a circuit diagram of the semiconductor memory device of FIG. 2, according to an embodiment of the present invention.

FIG. 3 shows a circuit diagram of portions of the semiconductor memory device 100 of FIG. 1 including the pad connection unit 130 according to an embodiment of the present invention. In the example of FIG. 3, the bump pad 122 and the test pad 142 are for outputting a signal from the internal integrated circuit 110. Differential output signals DOK and DOKB are converted into a single-ended output signal applied on the bump pad 122 through a first output buffer 111.

Further referring to FIG. 3, the pad connection unit 130 includes a first switch 131, a second switch 132, a first latch 133, a second latch 134, a first inverter 135, a second inverter 136, and a second output buffer 137. The pad connection unit 130 responds to the mode signal TM that is a control signal for controlling a first pass-gate T1 and a second pass-gate T2.

The first output buffer 111 includes a PMOSFET (P-channel metal oxide semiconductor field effect transistor) P1 and an NMOSFET (N-channel metal oxide semiconductor field effect transistor) N1. The PMOSFET P1 includes a source connected to a high supply voltage VDD, a gate having a first signal DOK from the integrated circuit 110 applied thereon, and a drain connected to the bump pad 122. The NMOSFET N1 includes a drain connected to the bump pad 122, a gate having a second signal DOKB from the integrated circuit 110 applied thereon, and a source connected to a low supply voltage VSS such as a ground voltage.

The mode signal TM and an inversion of the mode signal TM generated by the inverters INV1 and INV5 are applied on the gates of the first and second pass gates T1 and T2 of the switches 131 and 132. If the mode signal TM is at a logic 'high' state indicating the test mode, the pass gates T1 and T2 are turned on to couple the signals DOK and DOKB to the latches 133 and 134.

The first latch 133 is formed as a loop of two inverters INV2 and INV3, and the second latch 134 is formed as a loop of two inverters INV6 and INV7. The first latch 133 latches an inversion of the signal DOK from the first pass gate T1, and the second latch 134 latches an inversion of the signal DOKB from the second pass gate T2. The output of the latches 133 and 134 are inverted by the inverters INV4 and INV8, respectively. The outputs of the inverters INV4 and INV8 are applied at the gates of a PMOSFET P2 and an NMOSFET N2, respectively, of the second output buffer 137.

In the second output buffer 137, the PMOSFET P2 also includes a source connected to the high supply voltage VDD and a drain connected to the test pad 142. The NMOSFET N2 also includes a drain connected to the test pad 142 and a source connected to the low supply voltage VSS.

The present invention is described with the pads 122 and 142 in FIG. 3 being data output pads. However, the present invention may also be practiced with the pads 122 and 142 being input pads. For example, if the semiconductor memory device 100 is a dynamic random access memory (DRAM) device, input pads (i.e., address, /RAS, /WE, /CAS, and CKE, etc.) may be formed together with the above-described output pads.

Figure 6:
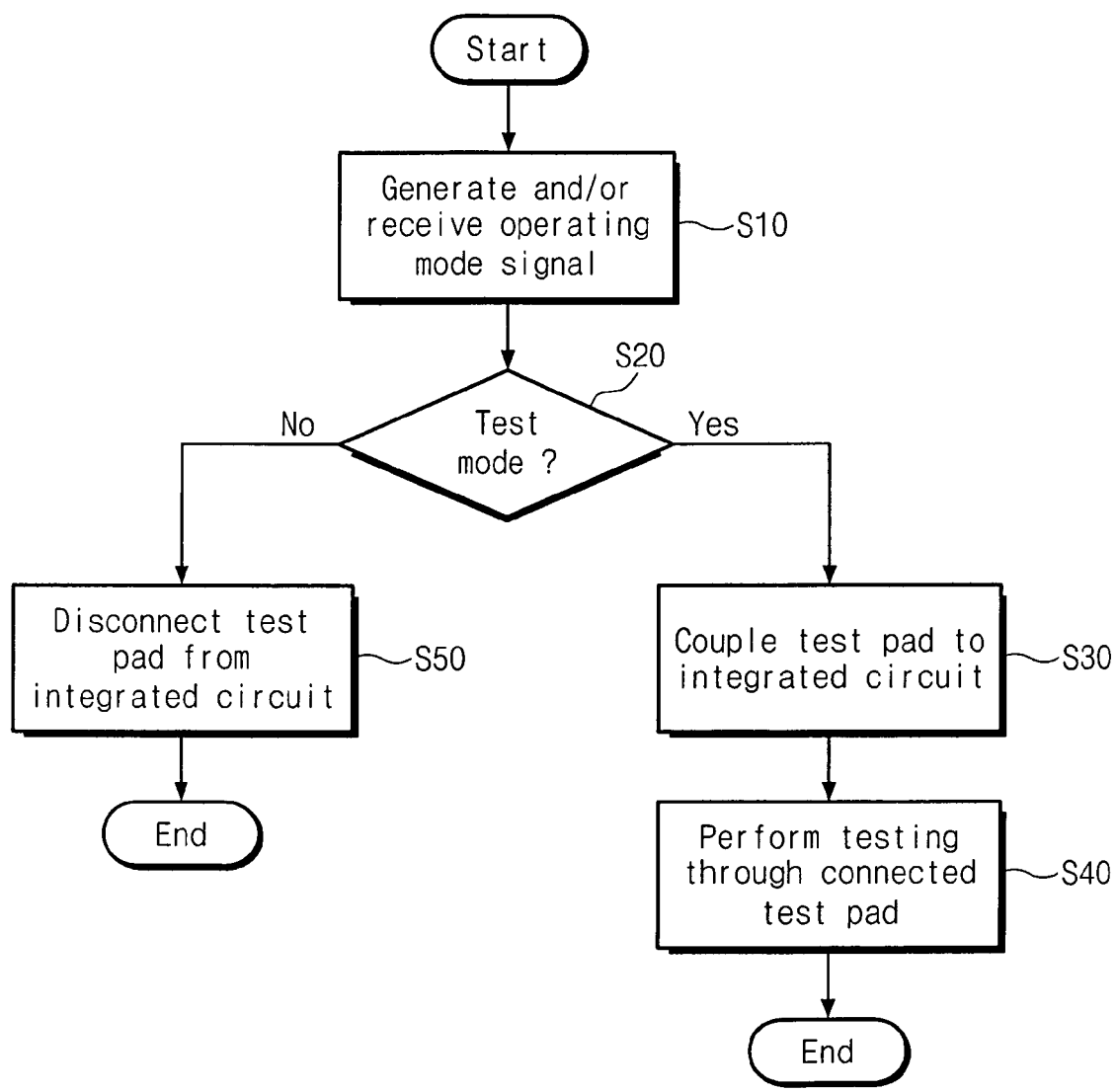
FIG. 6 is a flowchart of steps during operation of the portion of the semiconductor memory device of FIG. 2, according to an embodiment of the present invention.

FIG. 6 shows a flow-chart of steps during operation of the semiconductor memory device 100 of FIG. 2 or 3, according to an embodiment of the present invention. The mode signal TM is received by the pad connection unit 130 (step S10 in FIG. 6). The mode signal TM may be generated on-chip by the integrated circuit 110 or externally by a test system.

The logic state of the mode signal TM indicates the operating mode of the semiconductor memory device 100 (step S20 of FIG. 6). The mode signal TM being at the logic high state "1" for example indicates the test mode, while the mode signal TM being at the logic low state "0" indicates the normal operating mode.

When the mode signal TM is set to the logic high state "1", the pad connection unit 130 electrically couples the signals DOK and DOKB from the integrated circuit 110 to the gates of the MOSFETs P2 and N2, respectively, in the second output buffer 137. Another words, the pad connection unit 130 electrically couples the nodes of the integrated circuit 110 generating the signals DOK and DOKB to the test pad 142 via the second output buffer 137 (step S30 of FIG. 6). With such coupling, testing is performed on the integrated circuit 110 through the test pad 142 (step S40 of FIG. 6).

When the mode signal TM is set to the logic low state "0", the pad connection unit 130 disconnects the integrated circuit 110 from the test pad 142 (step S50 of FIG. 6). In that case, the integrated circuit 110 operates in the normal operating mode with transfer of the signals DOK and DOKB via the bump pad 122.

Figure 4:
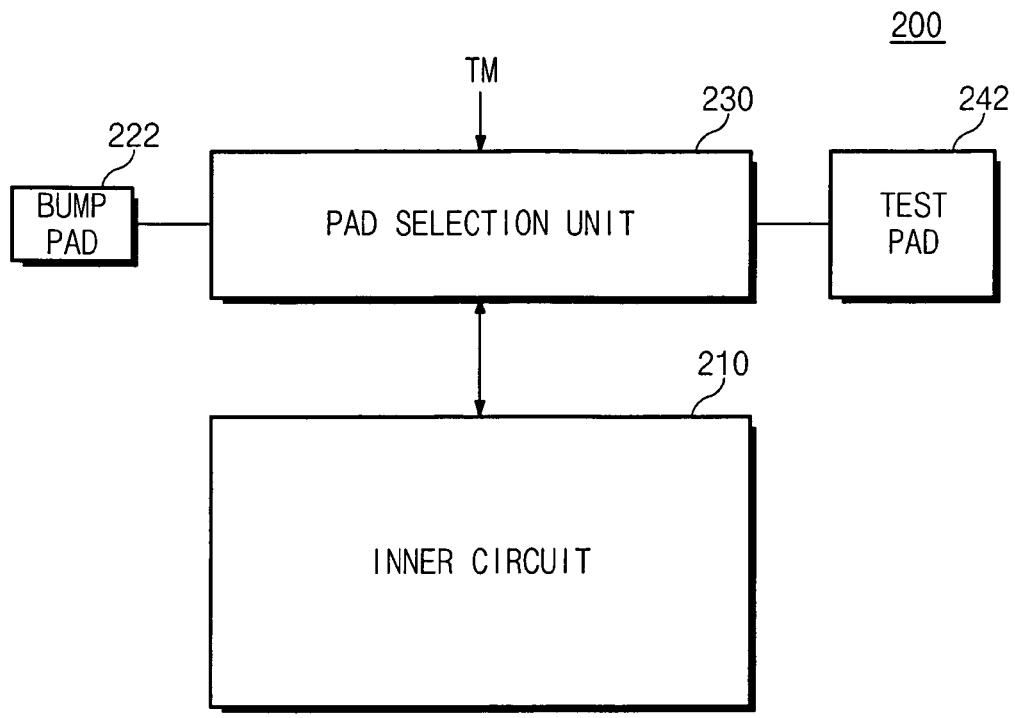
FIG. 4 is a block diagram of a portion of the semiconductor memory device of FIG. 1, according to another embodiment of the present invention.

FIG. 4 shows a block diagram of a semiconductor memory device 200 according to another embodiment of the present invention. The semiconductor memory device 200 may be similarly fabricated as the integrated circuit die 102 of FIG. 1. Referring to FIG. 4, the semiconductor memory device 200 includes an internal integrated circuit 210, a bump pad 222, a test pad 242, and a pad connection unit 230.

Figure 7:
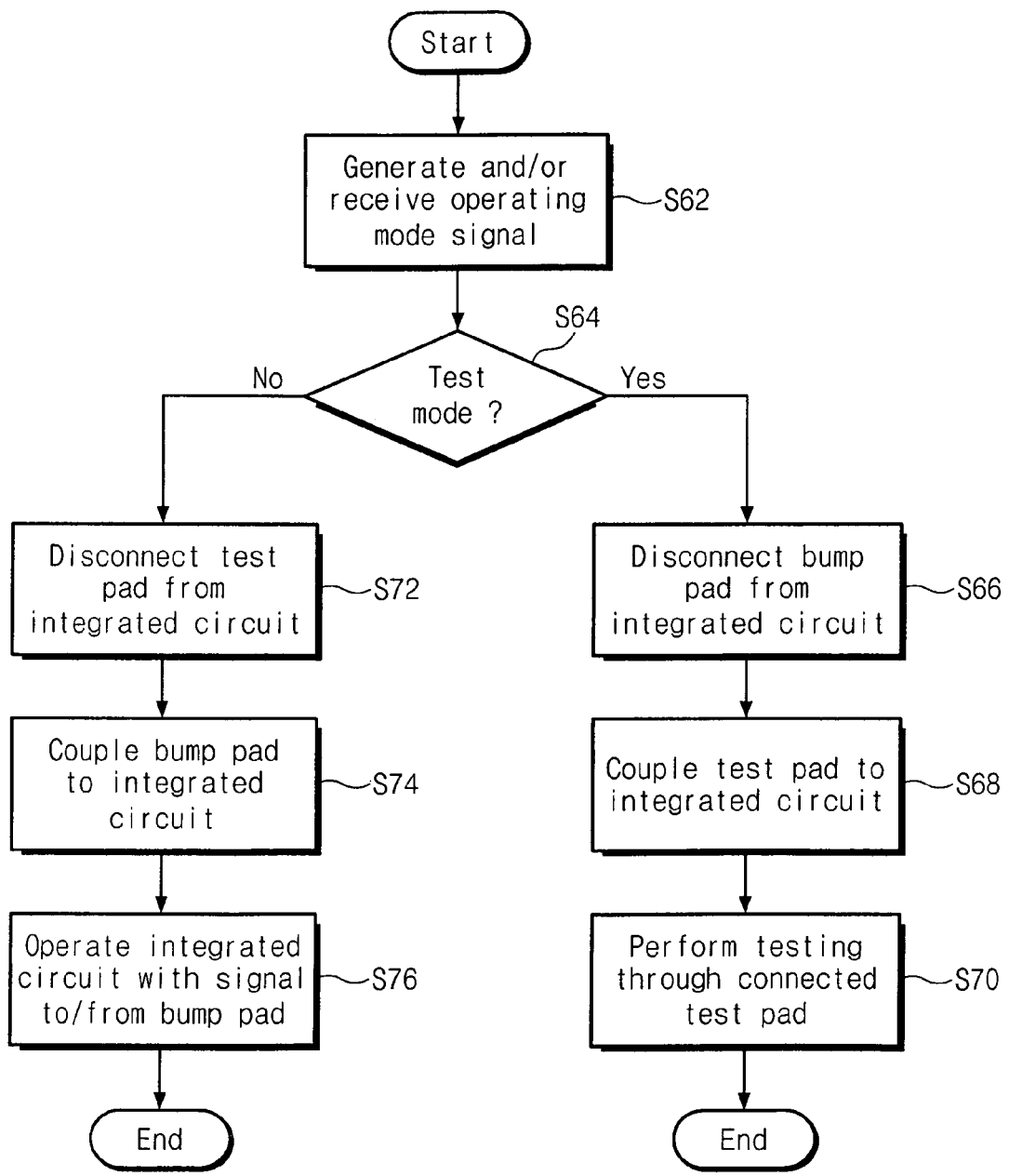
FIG. 7 is a flowchart of steps during operation of the portion of the semiconductor memory device of FIG. 4, according to another embodiment of the present invention.

The pad connection unit 230 selects one of the bump pad 222 or the test pad 242 to be electrically coupled with the integrated circuit 210 according to the operating state of the semiconductor memory device 200 as indicated by the mode signal TM. FIG. 7 shows a flow-chart of steps during operation of the semiconductor memory device 200 of FIG. 4, according to an embodiment of the present invention. Referring to FIGS. 4 and 7, the mode signal TM is received by the pad connection unit 230 (step S62 in FIG. 7). The mode signal TM may be generated on-chip by the integrated circuit 210 or externally by a test system.

The logic state of the mode signal TM indicates the operating mode of the semiconductor memory device 200 (step S64 of FIG. 7). The mode signal TM being at the logic high state "1" for example indicates the test mode, while the mode signal TM being at the logic low state "0" indicates the normal operating mode.

When the mode signal TM is set to the logic high state "1", the pad connection unit 230 disconnects the bump pad 222 from the integrated circuit 210 (step S66 of FIG. 7). Further in that case, the pad connection unit 230 electrically couples the integrated circuit 210 to the test pad 242 (step S68 of FIG. 7). With such coupling, testing is performed on the integrated circuit 210 through the test pad 242 (step S70 of FIG. 7).

When the mode signal TM is set to the logic low state "0", the pad connection unit 230 disconnects the test pad 242 from the integrated circuit 210 (step S72 of FIG. 7). Also in that case, the pad connection unit 230 electrically couples the integrated circuit 210 to the bump pad 222 (step S74 of FIG. 7). In that case, the integrated circuit 210 operates in the normal operating mode with transfer of signals via the bump pad 222.

Figure 5:
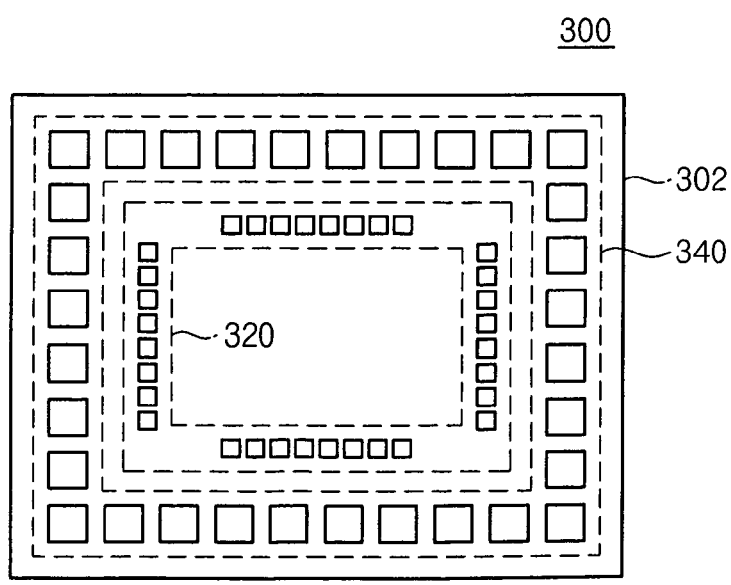
FIG. 5 is a plan view of a semiconductor memory device according to a further embodiment of the present invention.

FIG. 5 shows an alternative embodiment of the present invention with alternative locations of bump pads 320. In the case of FIG. 5, both the bump pads 320 and the test pads 340 are disposed near the perimeter of an integrated circuit die 302 forming a semiconductor memory device 300.

In this manner, the test pads 140 or 340 may be formed to have larger area than the bump pads 120 or 320 such that test probes may easily be placed onto the test pads 140 or 340. However, to reduce capacitance connected to the integrated circuit during normal operation, the test pads 140 or 340 are disconnected from the integrated circuit.

While the present invention has been particularly shown and described with reference to an exemplary embodiment thereof, it will be understood by those of ordinary skill in the art that various changes in form and details may be made therein without departing from the spirit and scope of the present invention as defined by the following claims.

The present invention is limited only as defined in the following claims and equivalents thereof.

What is claimed is:

1. A semiconductor device comprising:
   at least one first type of pad;
   at least one second type of pad having a different area from the first type of pad; and
   a pad connection unit for electrically coupling the at least one second type of pad to an integrated circuit of the semiconductor device during a predetermined operating mode that is a test mode,
   wherein at least one test signal is applied on said at least one second type of pad during said test mode, and wherein no test signal is applied on said at least one first type of pad during said test mode.

2. The semiconductor device of claim 1, wherein the pad connection unit disconnects the at least one second type of pad from the integrated circuit during an operating mode that is not the predetermined operating mode.

3. The semiconductor device of claim 2, wherein the pad connection unit generates a high impedance between the at least one second type of pad and the integrated circuit during the operating mode that is not the predetermined operating mode.

4. The semiconductor device of claim 1, wherein the at least one second type of pad has a larger area than an area of the at least one first type of pad such that the first type of pad has a smaller capacitance than the second type of pad.

5. The semiconductor device of claim 4, wherein the at least one second type of pad has an area that sufficiently makes electrical contact with a test probe during wafer testing of the semiconductor device.

6. The semiconductor device of claim 4, wherein the at least one second type of pad is disposed in a periphery area of the semiconductor device.

7. The semiconductor device of claim 4, wherein the at least one first type of pad is disposed in a center area of the semiconductor device.

8. The semiconductor device of claim 7, wherein the at least one first type of pad is a bump pad for the semiconductor device formed as part of a flip-chip package.

9. The semiconductor device of claim 1, wherein the at least one first type of pad is a bump pad for the semiconductor device formed as part of a flip-chip package.

10. The semiconductor device of claim 9, wherein the semiconductor device is a memory device.

11. The semiconductor device of claim 1, wherein the pad connection unit includes:
    an output buffer coupled to the at least one second type of pad; and pass-gates controlled by a mode signal to electrically couple the integrated circuit to the at least one second type of pad via the output buffer during the predetermined operating mode.

12. The semiconductor device of claim 11, wherein the pass-gates are controlled to electrically couple at least one node of the integrated circuit to the at least one second type of pad during the predetermined operating mode.

13. The semiconductor device of claim 12, further comprising:
    another output buffer electrically coupled to the at least one node at all times.

14. The semiconductor device of claim 1, wherein the pad connection unit disconnects the at least one first type of pad from the integrated circuit during the predetermined operating mode.

15. The semiconductor device of claim 14, wherein the pad connection unit electrically couples the at least one first type of pad to the integrated circuit for an operating mode that is not the predetermined operating mode.

16. The semiconductor device of claim 15, wherein the pad connection unit disconnects the at least one second type of pad from the integrated circuit during the operating mode that is not the predetermined operating mode.

17. The semiconductor device of claim 16, wherein the at least one second type of pad has a larger area than an area of the at least one first type of pad such that the first type of pad has a smaller capacitance than the second type of pad.

18. The semiconductor device of claim 17, wherein the at least one second type of pad is disposed in a periphery area of the semiconductor device, and wherein the at least one first type of pad is disposed in a center area of the semiconductor device.

19. The semiconductor device of claim 18, wherein the at least one first type of pad is a bump pad for the semiconductor device that is a memory device formed as part of a flip-chip package.

* * * * *